United States Patent [19]

Lipson et al.

[11] 4,239,849

[45] Dec. 16, 1980

[54] POLYMERS FOR AQUEOUS PROCESSED PHOTORESISTS

[75] Inventors: Melvin A. Lipson; Eugene Zador, both of Fullerton, Calif.

[73] Assignee: Dynachem Corporation, Santa Ana, Calif.

[21] Appl. No.: 916,433

[22] Filed: Jun. 19, 1978

Related U.S. Application Data

[63] Continuation of Ser. No. 841,161, Oct. 3, 1977, abandoned, which is a continuation of Ser. No. 727,498, Sep. 28, 1976, abandoned, which is a continuation of Ser. No. 511,929, Oct. 4, 1974, abandoned.

[51] Int. Cl.$^2$ .............................................. G03C 1/68
[52] U.S. Cl. .................................. 430/281; 430/905; 430/910
[58] Field of Search .................... 96/115 P, 90 R, 47; 430/281, 905, 910

[56] References Cited

U.S. PATENT DOCUMENTS

| | | | |
|---|---|---|---|
| 3,765,898 | 10/1973 | Bauer et al. | 96/115 P |
| 3,833,384 | 9/1974 | Noonan et al. | 96/115 P |
| 3,850,770 | 11/1974 | Juna et al. | 96/115 P |

FOREIGN PATENT DOCUMENTS 1361298 7/1974 United Kingdom.

*Primary Examiner*—Jack P. Brammer
*Attorney, Agent, or Firm*—Stanley A. Marcus; Royal E. Bright

[57] ABSTRACT

A new photopolymerizable composition which contains an addition polymerizable monomer, a photoinitiator, and an improved binding agent which is a polymer of three types of monomeric materials, namely, a styrene-type monomer, an acrylate monomer, and an alpha, beta-unsaturated carboxyl-containing monomer. These compositions are useful for flexible photopolymerizable films which, after exposure, may be developed in aqueous alkaline solutions. These films may be used as photo-resists, screen stencils and printing plates.

11 Claims, No Drawings

POLYMERS FOR AQUEOUS PROCESSED PHOTORESISTS

This is a continuation of application Ser. No. 841,161 filed Oct. 3, 1977 now abandoned, which is a continuation of application Ser. No. 727,498 filed Sept. 28, 1976 now abandoned, which is a continuation of application Ser. No. 511,929 filed Oct. 4, 1974 now abandoned.

This invention relates to a new and improved photopolymerizable composition and a method for using the same. More particularly, the invention teaches a light-sensitive composition which can be readily developed by means of an aqueous alkaline solution to yield a product which is useful as a flexible photopolymerizable film. These compositions are particularly useful as photo-resists for the manufacture of printed circuits because the resists formed therefrom are impervious to conventional plating and etching solutions. They are also useful for making screen stencils and printing plates.

The desirability of forming light-sensitive compositions which can be developed without the need of the conventional organic solvents has long been recognized. Organic solvents are costly, hazardous with respect to toxicity and flammability, and pollute the air and water. Systems which are developable in aqueous alkaline solutions are described in British Pat. No. 1,361,298. While these compositions are most useful for their intended purpose, when used as dry film laminates they suffer the disadvantages of poor flexibility. A brittle film will not only crack during and prior to use, but it also fails to slit properly when the master rolls are cut to the specific size required by the user. The edges of the slit rolls sliver and the photopolymerizable layer separates from its polyester base. In areas where this occurs, the layer will not expose properly and, therefore, loses its ability to perform as a resist after development. As a result, a brittle film simply cannot be used in flexible circuit-building applications, since it will crack and fall off the circuit board when it is bent.

In the prior art, external plasticizers have been incorporated in the photopolymerizable material to overcome the poor flexibility. This, however, has not been entirely satisfactory because such plasticizers tend to migrate within the film on aging and contribute heavily to the cold flow. Cold flow cannot be tolerated because the film rolls are stored under static load and, after a short time, the photopolymerizable material begins to ooze out from between the layers. Thereafter, the material which has oozed out fuses along the edge of the rolls and makes it difficult, if not impossible, to unroll the material evenly and without destroying the composite film. Furthermore, external plasticizers are volatile. During the manufacturing of the film, if drying is not precisely controlled, some of the plasticizer will volatilize, thereby returning the film to its brittle state.

In accordance with this invention, it has now been discovered that aqueous developable photopolymerizable compositions can be produced which may be formed into dry films having excellent flexibility in the absence of external plasticizers and high resistance to cold flow. Upon exposure, the polymerized portions of these compositions have outstanding resistance to the typical solutions encountered in the fabrication of printed circuits and chemically machined parts, including alkaline etchants and alkaline plating solutions.

In brief, the advantages of the invention are obtained by selecting a performed, compatible macromolecular polymeric binding agent which is a copolymer of (1) a styrene-type monomer, (2) an acrylate-type monomer, and (3) an unsaturated carboxyl-containing monomer. The first component lends hardness and chemical resistance to the polymer; the second, flexibility and plasticity to the polymer backbone; and the third, alkali-solubility.

The photopolymerizable compositions of this invention are composed of (1) from 10 to 60 parts by weight of a conventional addition polymerizable non-gaseous ethylenically unsaturated compound, (2) 40 to 90 parts by weight of the aforesaid binding agent, and (3) from 1 to 10 parts by weight of a conventional free-radical photo-initiator. Up to 5 parts by weight of a conventional thermal addition polymerization inhibitor may also be added, preferably from 0.005 to 2.0 parts. Additionally, the compositions may contain suitable dyes and pigments and other additives, such as plasticizers and adhesion promoters, as may be necessary to enhance the physical and chemical properties of the photopolymerizable composition.

The ethylenically unsaturated compound must contain at least one terminal ethylenic group ($CH_2=C<$) having a boiling point above 100° C. at atmospheric pressure and be capable of forming a high polymer by free-radical photo-initiated, chain propagating addition polymerization. Such compounds are disclosed in U.S. Pat. No. 2,760,863.

Preferably, the compounds are liquid or solid under ambient conditions, have 1 to 4 or more terminal ethylenic groups, preferably 2 or more, and a plasticizing action on the thermoplastic polymeric binder. Suitable compounds, which may be used alone or in combination, include an alkylene or a polyalkylene glycol diacrylate prepared from the alkylene glycols having 2 to 15 carbons or the polyalkylene ether glycols of 1 to 10 ether linkages.

Because of their generally more rapid rate of insolubilization on exposure, presumably due to a relatively rapid establishment of a network polymer structure, an outstanding class of the low molecular weight addition polymerizable components are those having a plurality of addition polymerizable ethylenic linkages, particularly when present as terminal linkages, and especially those wherein at least one and preferably most of such linkages are conjugated with a double bonded carbon, including carbon double bonded to carbon and to such heteroatoms as nitrogen, oxygen, and sulfur. Outstanding are such materials wherein the ethylenically unsaturated groups, especially the vinylidene groups, are conjugated with ester or amide structures. The following specific compounds are further illustrative of this class: unsaturated esters of polyols, particularly such esters of the methylene carboxylic acids, e.g., ethylene diacrylate; diethylene glycol diacrylate; tetraethylene glycol diacrylate; glycerol diacrylate; trimethylolpropane triacrylate; glycerol triacrylate; ethylene dimethacrylate; 1,3-propylene dimethacrylate; 1,2,4-butane triol trimethacrylate; 1,4-benzene-diol dimethacrylate; pentaerythritol tetramethacrylate; 1,3-propanediol diacrylate; 1,5-pentanediol dimethacrylate; the bis-acrylates and methacrylates of polyethylene glycols and ethoxylated alcohols and phenols, such as bis 4,4'-(2-hydroxyethyl)phenyl-2,2'-propane, and the like; unsaturated amides, particularly those of the methylene carboxylic acids, and especially those of alpha,omega-diamines and oxygen-interrupted omega-diamines, such as methylene bisacrylamide; methylene bis-methacrylamide; 1,6-hexamethylene bis-acrylamide; diethylene triamine tris-methacrylamide; bis(methacrylamidopropoxy)ethane; beta-methacrylamidoethyl methacrylate; N-[(beta-hydroxyethyloxy)ethyl] acrylamide; vinyl esters such as divinyl succinate, divinyl adipate, divinyl phthalate, divinyl terephthalate, divinyl benzene-1,3-disulfonate, and divinyl butane-1,4-disulfonate; and unsaturated aldehydes, such as sorbaldehyde (hexadienal).

The preferred monomeric compounds are di- or polyfunctional, but monofunctional monomers can also be used. The amount of monomer added varies with the particular thermoplastic polymers.

The styrene-type constituent of the polymeric binder may have the general formula:

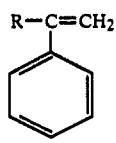

wherein R is hydrogen or an alkyl group having from 1 to 6 carbon atoms or a halo group. The benzene ring may be ring substituted with functional groups, such as nitro, alkoxy, acyl, carboxyl, sulpho, hydroxyl or halo. From 1 to 5 benzene substituents may be present; preferably, the substituents are a single alkyl group such as a methyl or t-butyl group. Most preferred of these compounds are styrene, alpha-methyl styrene, para-methyl styrene and para-t-butyl styrene.

The acrylate-type component includes alkyl and hydroxyalkyl acrylates and methacrylates wherein the alkyl group has from 1 to 12, preferably from 1 to 6, carbon atoms. Examples of these materials include methyl methacrylate, ethyl acrylate, hydroxypropyl methacrylate, hydroxyethyl methacrylate and hydroxyethyl acrylate. Also, advantageously, mixtures of two or more of these compounds may be used.

The third comonomer may be one or more unsaturated carboxyl containing monomers having from 3 to 15 carbon atoms, preferably from 3 to 6. Most preferred compounds are acrylic acid and methacrylic acid. Other acids which may be used are cinnamic acid, crotonic acid, sorbic acid, itaconic acid, propiolic acid, maleic acid, and fumaric acid, or the corresponding half esters or, where possible, the corresponding anhydride.

The ratio of the three monomeric components in the binder must be selected so that the resultant photopolymerizable composition incorporating such binder has the following properties: firstly, the photopolymerizable composition must be flexible and hardy but not tacky; secondly, the unexposed photopolymerizable material must develop in an aqueous alkali solution having a pH of 9–14; thirdly, the photopolymerized material must be resistant to mildly alkaline plating solutions or etchants (such as copper pyrophosphate plating baths having a pH of about 8.5); fourthly, a 40% methyl ethyl ketone solution of the binder should have a viscosity of at least 2,000 centipoise, preferably from 2,500 centipoise to 8,000 centipoise, as measured by the Brookfield Viscometer.

The amount of the three types of monomeric material used in preparing the binder are set forth in the following table:

| Binder Component | Broad Range | Preferred Range |
|---|---|---|
| Styrene-type | 40–60% | 45–55% |
| Acrylate-type | 15–45% | 25–35% |
| Carboxylic acid-type | 15–40% | 18–30% |

In forming dry films, the coating and drying method used in the laboratory is as follows. A coating solution is prepared by stirring all of the ingredients in a methyl-ethyl ketone solution. The solution is diluted by the addition of additional ketone to a viscosity of 100 to 200 centipoise and thereafter coated onto a 10 foot long, 5 inch wide polyester section stretched over a heat hardened glass sheet. A uniform thin coating is obtained by using a Meyer rod or a Gardner draw-down knife. The thickness is controlled so that a 1 or 2 mil thick film is obtained after drying.

Drying may be accomplished by, for example, using a 150 watt, hot-air fan dryer. The dryer is located at one end of a lab-made tunnel covering the entire area to be dried. Hot air is forced through the tunnel continually for 20 minutes until all but a residual amount of solvent, approximately 0.1–2%, is evaporated from the film. This residual solvent does not interfere with the proper chemical and physical performance of the "dry" film resist.

The flexibility of the dried film is tested by crumpling the film into a loose ball and then smoothing the film out. The many sharp folds introduced into the film by this procedure will cause the film to crack or fall apart if the film is too brittle. A good flexible film remains as a continuous sheet.

Flexibility and the degree of latitude during drying may be tested by overdrying a film sample in a forced air convection oven for 10 min. at 180° F. The overdried sample is then tested as described above.

There are no accepted industry standards for testing the cold flow properties of thin, 1–2 mil, unsupported photopolymer films which can be directly related to the film's tendency to cold flow. The best method is to actually produce at least one 500 foot roll of a 2 mil photopolymerizable film, wind the sample around the core at the conventional tension, and let the film stand on its edge at room temperature for an extended period. A good film will be free of edge fusion for up to six months at 65°–75° F.

Two qualitative tests which closely correlate with the foregoing empirical test to determine cold flow are the Sward hardness and the "cold-flow-under-vacuum" tests. The Sward hardness number is determined by comparing the surface hardness of the film sample to that of glass which is used as the control. The Sward rocker is first calibrated to give a reading of 100 for the glass and thereafter a reading is taken of the test sample laminated onto the sample glass sheet. It has been found that a good 1 mil aqueous-developable film should have a Sward number of from 10 to 20 and a good 2 mil film in the range of 8 to 14.

In the "cold-flow-under-vacuum" as a static load, the sample of film is laminated to copper and, with the polyester base still in place, a narrow wire (12–13 mils in diameter) is placed on top. The whole system is put under a vacuum of 27 in. of mercury for 5 minutes. After treatment, the polyester base is carefully removed and the indentation made by the wire as well as the "oozing out from the edges" of the film are photographed. Photographs from experimental films are compared with films having known acceptable cold flow properties.

As noted, the resist from the practice of this invention is resistant to the usual plating and etching solutions. Most surprising is its resistance to the copper pyrophosphate solution which is used in pattern plating and has an extremely high alkalinity. Other solutions which leave the resist unaffected include ferric chloride, ammonium persulfate and chromic-sulfuric acid solutions.

The photoinitiators used in the compositions are preferably those activatable by actinic light and thermally inactive at 185° C. or below. These include the substituted or unsubstituted polynuclear quinones, such as 9,10-anthraquinone; 1-chloroanthraquinone, 2-chloroanthraquinone, 2-methylanthraquinone; 2-ethylanthraquinone; 2-tert-butylanthraquinone; octamethylanthraquinone; 1,4-naphthaquinone; 9,10-phenanthraquinone; 1,2-benzanthraquinone; 2,3-benzanthraquinone; 2-methyl-1,4-naphthaquinone; 2,3-dichloronaphthaquinone; 1,4-dimethylanthraquinone; 2,3-dimethylanthraquinone; 2-phenylanthraquinone; 2,3-diphenylanthraquinone; sodium salt of anthraquinone alphasulfonic acid; 3-chloro-2-methylanthraquinone; retenequinone; 7,8,9,10-tetrahydronaphthacenequinone; 1,2,3,4-tetrahydrobenz(a)anthracene-7,12-dione.

Also useful as photo-initiators are: vicinal ketaldonyl compounds, such as diacetyl and benzil; alpha-ketaldonyl alcohols and ethers, such as, benzoin, pivaloin; benzoin methyl and ethyl ethers, and alpha-hydrocarbon substituted aromatic acyloins, e.g., alpha-methylbenzoin, alpha-allylbenzoin and alpha-phenylbenzoin; and alpha,alpha-dialkoxyacylphenones, e.g., alpha,alpha-diethoxyacetophenone. The preferred initiators are aromatic ketones, e.g., benzophenone and 4,4'-bis-dialkylamino-benzophenones particularly, the dimethylamino compound known as Michler's Ketone.

While it is generally desirable to include an inhibitor to prevent thermal polymerization during drying and storage, it is not absolutely essential to the photopolymerizable composition. Thermal polymerization inhibitors which may be in preferred compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, 2,2-methylenebis(4-ethyl-6-t-butylphenol), phenothiazine, pyridine, nitrobenzene, dinitrobenzene, p-toluquinone, chloranil, aryl phosphites, and aryl alkyl phosphites.

If desired, the compositions may contain dyes and pigments. Suitable colorants will be compatible with the photosensitive compositions and not interfere appreciably with the photosensitivity of the composition. The following specific compounds are illustrative: Fuchsine (C.I. 42510); Auramine Base (C.I. 41000B); Calcocid Green S (C.I. 44090); Para Magenta (C.I. 42500); Tryparosan (C.I. 42505); New Magenta (C.I. 42520); Acid Violet RRH (C.I. 42425); Red Violet 5RS (C.I. 42690); Nile Blue 2B (C.I. 51185); New Methylene Blue GG (C.I. 51195); C.I. Basic Blue 20 (C.I. 42585); Iodine Green (C.I. 42556); Night Green B (C.I. 42115); C.I. Direct Yellow 9 (C.I. 19540); C.I. Acid Yellow 17 (C.I. 18965); C.I. Acid Yellow 29 (C.I. 18900); Tartrazine (C.I. 19140); Supramine Yellow G (C.I. 19300); Buffalo Black 10B (C.I. 27790); Naphthalene Black 12R (C.I. 20350); Fast Black L (C.I. 51215); Ethyl Violet (C.I. 42600); Pontacyl Wool Blue BL (C.I. 50315); Pontacyl Wool Blue GL (C.I. 52320). (Numbers obtained from the second edition of Color Index).

The photopolymerizable elements are exposed to a source of actinic radiation. This may be through a half-tone image or a process transparency, e.g., a process negative or positive, stencil, or a mask. The exposure may also be through a continuous tone, negative or positive image. The exposure may be by the contact or projection method, with or without a cover sheet over the photopolymerizable layer or by projection using a cover sheet. These procedures are well known to those skilled in the art.

Since free-radical generating addition-polymerization initiators acivatable by actinic radiation generally exhibit their maximum sensitivity in the ultraviolet range, the radiation source should furnish an effective amount of this radiation. Both point or broad radiation sources are effective. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sun lamps, are most suitable. In certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light.

The photopolymerizable compositions after exposure can be developed, e.g., by impingement of spray jets, with agitated immersion, brushing or scrubbing to desirable images with aqueous bases, i.e., aqueous solutions of water-soluble bases in concentrations generally in the range from 0.01% to 10% by weight.

Suitable bases for the development include the alkali metal hydroxides, e.g., lithium, sodium, and potassium hydroxide; the base-reacting alkali metal salts of weak acids, e.g., lithium, sodium, and potassium carbonates and bicarbonates; amines having a base-ionization constant greater than about $1 \times 10^{-6}$, e.g., primary amines, such as benzyl, butyl and allyl amines; secondary amines, e.g., dimethylamine and benzyl methyl amine; tertiary amines, e.g., trimethylamine, and triethylamine; primary, secondary, and tertiary hydroxyamines, e.g., propanol, diethanol and triethanol amines, and 2-amino-2-hydroxymethyl-1,3-propanediol; cyclic amines, e.g., morpholine, piperidine, piperazine, and pyridine; polyamines, such as hydrazine, ethylene and hexamethylene amines; the water-soluble basic salts, e.g., the carbonates and bicarbonates of the above amines; ammonium hydroxide and tetra-substituted ammonium hydroxides, e.g., tetramethyl-, tetraethyl-, trimethylbenzyl-, and trimethylphenylammonium hydroxides, sulfonium hydroxides, e.g., trimethyl-, diethylmethyl-, dimethylbenzylsulfonium hydroxides, and the basic soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethylphosphonium hydroxide.

The photopolymerized compositions can generally be removed by immersion in heated aqueous solutions of strong alkalies or, if desired, in proprietary stripping formulas well known in the art.

To further illustrate the invention, attention is directed to the following examples.

EXAMPLE I

The following solutions were coated onto 1 mil thick polyester film, and dried in a current of hot air, provided by a GE-1500 watt fan drier, for 20 minutes. The dry thickness of the sensitized layers were about 1 mil. The dried layers were covered with a 1 mil thick polyethylene film. Solution A shows the practice of the invention while Solution B is a control solution.

| Solution A | |
|---|---|
| (a) Copolymer of 50% styrene, 20% methyl methacrylate, 10% ethyl acrylate, and 20% methacrylic acid; viscosity of 40% methylethyl ketone solution = 4,500 cps at 25° C. | 40.0g |
| (b) Ethoxylated Bisphenol-A diacrylate* | 14.0g |
| (c) Tetraethylene glycol diacrylate | 7.0g |
| (d) Benzophenone | 2.25g |
| (e) 4,4'-bis-(dimethylamino)benzophenone | 0.30g |
| (f) Hydroquinone | 0.03g |
| (g) Benzotriazole | 0.12g |
| (h) Dyes | 0.07g |
| (i) Methylethyl ketone | 210.0g |
| Solution B | |
| (a) Copolymer of 75% styrene and 25% methacrylic acid, viscosity of 40% solution in methylethyl ketone is 1,000 cps | 40.0g |
| (b) Trimethylolpropane triacrylate | 14.0g |
| (c) Tetraethylene glycol diacrylate | 7.0g |
| (d) Triethylene glycol diacetate | 1.02g |
| (e) Tricresyl phosphate | 2.28g |
| (f) Benzophenone | 2.25g |
| (g) 4,4'-bis-(dimethylamino)benzophenone | 0.30g |
| (h) 2,2'-methylene-bis-(4-ethyl-6-tert-butylphenol) | 0.30g |
| (i) Benzotriazole | 0.15g |
| (j) Dyes | 0.07g |
| (k) Methyl ethyl ketone | 210.0g |

*SR-349, Trademark of Sartomer Industries for the diethoxylated compound.

A piece of copper-clad, epoxy fiberglass board was cleaned by scouring with an abrasive cleanser, swabbing and thoroughly rinsing in water. It was then given a 20 second dip in a 12% solution of hydrochloric acid, rinsed again with water and dried with air jets.

The polyethylene cover sheet was removed from a section of the sandwiched photopolymerizable element. The bared resist coating with its polyester support was laminated to the clean copper with the surface of the photopolymerizable layer in contact with the copper surface, using rubber covered rollers operating at a rate of 2 feet per minute at 250° F., with a pressure of 3 pounds per lineal inch at the nip. The resulting sensitized copper-clad board, protected by the polyester film, was exposed to light through a high-contrast transparency for a period of 30 seconds using a 400 watt, 50 ampere mercury vapor lamp at a distance of 12 inches.

The polyester (polyethylene terephthalate) support film was peeled off and the exposed resist layer developed by agitating the board in a tray containing a 1%-1.5% aqueous solution of potassium hydroxide together with a small amount of a surfactant for approximately 1 minute followed by a water rinse. This method of development is satisfactory for the composition of Solution A as well as of Solution B.

The surface of the exposed copper was further cleaned after development by dipping the board into a 20% ammonium persulfate bath for 30 seconds, washing copiously with water, dipping for 30 seconds in a 20% solution of hydrochloric acid in water, rinsing with water, then drying the board with jets of air. This cleaned board was then plated for 45 minutes at 30 amperes per square foot in a copper pyrophosphate plating bath at 55° C. Both resist compositions protected the underlying copper surface equally well from attack by components of the copper pyrophosphate plating bath.

The major difference between the two compositions is that Solution B employs a polymeric binder which in itself is a very poor, brittle film-former and external plasticizers (components (c) and (d), Solution B) have to be included in the formulation to impart sufficient flexibility to the photosensitive resist film, while the copolymer described in Solution A is internally plasticized and is a much improved film-former. This copolymer significantly improves the drying latitude, integrity (film cohesion) and resistance to cold-flow or creep under static load of the photoresist product.

The flexibility of the films formed from the two solutions is tested by removing the polyethylene cover sheet from a strip of the sandwich structure, crumpling the supported film into a ball, and smoothing it out as described previously.

The flexibility test is also performed on films formed from Solutions A and B that have been dried in a forced air convection oven at 180° F. for 10 minutes, in addition to the normal drying procedure, to determine the drying latitude of the photopolymerizable resist film. Good drying latitude is an important requirement for a commercial dry film resist because such a product is not unduly dependent on residual solvent for flexibility and it has good shelf-life.

In the following Table, compositions from Solutions A and B are rated to indicate the significant differences between the two films regarding flexibility, surface tackiness, and drying latitude.

TABLE A

| | Conventional Drying | | After Extra Drying | |
|---|---|---|---|---|
| Composition | Flexibility | Surface Tackiness | Flexibility | Surface Tackiness |
| Solution A | Good | Low | Good | Low |
| Solution B | Fair | Slightly Tacky | Poor | Low |

Cold-flow or plastic creep under a static load is a serious problem with dry film resists in general. Dry resists are sold as rolls of various lengths and widths. These rolls are wound under a certain amount of tension, to reduce "telescoping" or slipping of subsequent layers past one another, which induces plastic creep. The effects of cold-flow are edge fusion or the fusing together of edges of contiguous layers, with the result that the roll cannot be unwound without removing some of the photopolymerizable layer from its polyester base, and the development of pinholes or even larger discontinuities within the dry film. Such a product is not acceptable to the customer because the resist will not polymerize during exposure in the areas where it has been separated from its base and pinholes can result in breaks within the printed circuit conductor lines.

Cold-flow is especially pronounced with aqueous processable dry film resists of the prior art, of which the composition in Solution B is a typical example, because the binder resin includes a large proportion (usually 20%-25%) of carboxylic acid containing chain segments. These segments tend to make the film brittle. The film is made flexible with external plasticizers which increase surface tackiness and contribute heavily to creep. The composition in Solution A is free from these shortcomings because the plasticizing components are an integral part of the binder polymer backbone.

Using the cold-flow test described above, the wound dry film rolls are stored and examined. Under these conditions, a 2 mil thick dry film photoresist made from the composition in Solution B showed significant signs of cold-flow within two weeks and the roll became unsalable after one month storage. The film manufactured from the coating liquid described in Solution A, on the other hand, was free of edge fusion or internal pinholing even after seven months storage.

Using the Sward hardness test, the following results are obtained for the compositions of Solutions A and B:

TABLE B

| Composition | Sward Hardness | |
|---|---|---|
|  | 1 mil film | 2 mil film |
| Solution A | 16–18 | 10–12 |
| Solution B | 8–10 | 4–6 |

Photographs of experimental films were compared with those from resist samples known to have acceptable cold-flow properties. The film from Solution A showed significantly less wire indentation than the corresponding film from Solution B, and very little "oozing out" at the edge.

EXAMPLE II

The following composition was prepared, coated onto a 1 mil thick polyester film, dried to a thickness of approximately 1 mil as described in Example I, and covered with polyethylene.

| Solution C | |
|---|---|
| (a) Copolymer of 50% styrene, 20% methyl methacrylate, 10% ethyl acrylate, and 20% methacrylic acid; viscosity of 40% methylethyl ketone solution is 4,500 cps | 40.0g |
| (b) Trimethylolpropane triacrylate | 13.33g |
| (c) Tetraethylene glycol diacrylate | 6.67g |
| (d) Benzophenone | 2.25g |
| (e) 4,4'-bis-(dimethylamino)-benzophenone | 0.30g |
| (f) 2,2'-methylene-bis-(4-ethyl-6-tert-butylphenol) | 0.30g |
| (g) Benzotriazole | 0.10g |
| (h) Dyes | 0.07g |
| (i) Methylethyl ketone | 210.0g |

A piece of copper-clad, epoxy fiberglass board was cleaned and laminated with the film made from the above composition. Another board was laminated with a control film prepared from the composition described in Solution B in Example I. Each board was exposed, developed, and plated in the copper pyrophosphate bath in accordance with the procedure outlined in Example I. Both resists gave excellent plating results in this hot, alkaline plating bath.

Example II shows that the physical properties of the new dry film resist is affected by the monomeric components. Solution C contains trimethylolpropane triacrylate instead of ethoxylated Bisphenol-A diacrylate (Solution A). This change has no effect on the flexibility or drying latitude of the photopolymerizable resist film, but causes a reduction in its Sward hardness number, as shown in Table C.

TABLE C

| Composition | Sward Hardness | |
|---|---|---|
|  | 1 mil film | 2 mil film |
| Solution A | 16–18 | 10–12 |
| Solution C | 12–14 | 8–10 |

Rolls made from the composition from Solution C were production coated to 2 mils and tested for cold-flow as described in Example I. The behavior was better than that shown for the composition made from Solution B.

EXAMPLE III

The following composition was prepared and coated onto a 1 mil thick polyester film, dried to the dry thickness of approximately 1 mil as described in Example I, and covered with polyethylene.

| Solution D | |
|---|---|
| (a) Copolymer of 40% styrene, 5% methyl methacrylate, 25% ethyl acrylate, and 30% methacrylic acid; viscosity of 40% methylethyl ketone solution is 5,800 cps | 40.0g |
| (b) Trimethylolpropane triacrylate | 14.0g |
| (c) Tetraethylene glycol diacrylate | 7.0g |
| (d) Benzophenone | 1.50g |
| (e) 4,4'-bis-(dimethylamino)-benzophenone | 0.20g |
| (f) 2,2'-methylene-bis-(4-ethyl-6-tert-butylphenol) | 0.30g |
| (g) Tolyltriazole | 0.04g |
| (h) Benzotriazole | 0.12g |
| (i) Dye | 0.06g |
| (j) Methylethyl ketone | 210.0g |
| (k) Methyl Cellosolve | 10.5g |

A piece of copper-clad, epoxy fiberglass board was cleaned and laminated with the above film, and the laminated board was exposed according to the procedure outlined in Example I. Unexposed portions of the film were washed off by agitating the board in a tray containing 1.5% sodium carbonate in water for from 30 to 60 seconds.

The board was etched with a 45° Baume solution of ferric chloride, rinsed and dried. The resist was removed from the copper by dipping for 2 minutes in a 3% solution of sodium hydroxide at 130° F. The result was a high quality printed circuit board.

The flexibility and drying latitude of the 1 mil photosensitive film was good and the Sward hardness number was 12–14.

EXAMPLE IV

A copper-clad piece of epoxy fiberglass board was cleaned as described in Example I. The cleaned and dried board was sensitized by laminating it with a 1 mil resist film prepared from the following solution:

| Solution E | |
|---|---|
| (a) Copolymer of 47.5% styrene, 20% methyl methacrylate, 10% acrylonitrile, and 22.5% methacrylic acid; viscosity of 38% methylethyl ketone solution is 3,700 cps | 40.0g |
| (b) Trimethylolpropane triacrylate | 14.0g |
| (c) Tetraethylene glycol diacrylate | 7.0g |
| (d) Benzophenone | 2.25g |
| (e) 4,4'-bis-(dimethylamino)-benzophenone | 0.30g |
| (f) 2,2'-methylene-bis-(4-ethyl-6-tert-butylphenol) | 0.30g |
| (g) Benzotriazole | 0.15g |

| Solution E | |
|---|---|
| (h) Dyes | 0.07g |
| (i) Methylethyl ketone | 210.0g |

The laminated board was exposed to actinic radiation in the manner described in Example I. Unexposed portions of the resist film were washed off by agitating the board in a tray containing 2% trisodium phosphate in water and a small amount of surfactant for approximately 1 minute.

The flexibility and drying latitude of the 1 mil photosensitive film was good, the surface of the resist was tack-free, and the Sward hardness number was 16–18.

Boards developed in the above described 2% trisodium phosphate solution were further cleaned as described in Example I and plated for 45 minutes at 30 amperes per square foot in a standard copper pyrophosphate plating bath at 55° C. Excellent results were obtained.

EXAMPLE V

The photopolymerizable Solution A of Example I was coated onto zinc, magnesium, and copper printing plates. After drying in warm air to a dry thickness of about 1 mil, the photopolymerizable layer was coated with a dilute aqueous solution of polyvinyl alcohol and redried with warm air. The water-soluble polymer formed a thin protective barrier to oxygen. These presensitized metal plates may be stored for extended periods.

Upon exposure to actinic light through a suitable photographic negative, the unexposed photosensitive layer and the water-soluble topcoat can be developed simultaneously, leaving the metal plate ready for etching. The photopolymerized image area then serves as an excellent resist for the deep-etching processes normally encountered in the fabrication of metal printing plates. These resists are resistant to the common etchants, e.g., ferric chloride and nitric acid, filming agents, and banking agents commonly added to the etching mixture to control the geometry of the etch.

EXAMPLE VI

The procedure of Example V is followed, except that a 1 mil thick film of polyester is used as a protective layer instead of a water-soluble polymer. Following exposure to actinic light, the protective layer is peeled off prior to developing in an aqueous alkaline solution. As in Example V, the photopolymerized image area serves as an excellent resist for the deep-etching of printing plates.

EXAMPLE VII

Solution A of Example I is coated onto a 1 mil thick polyester film, dried in air, and covered with a 1 mil thick polyethylene film. This three layer film sandwich can be stored in sheets or rolls in light-safe areas for indefinite periods of time. Prior to use, the polyethylene cover film is peeled off, and the photosensitive layer is placed in contact with a metallic plate of the type described in Example V and backed by lamination. Upon exposure to actinic light, the protective polyester layer is peeled off and developed in aqueous alkaline solution. As in Example V, the photopolymerized image area is an excellent resist for the deep-etching of printing plates.

EXAMPLE VIII

Solution A of Examle I is coated onto thin aluminum plates as commonly used in offset lithography by procedures described in Example V, VI and VII. Following exposure to actinic light and development in aqueous alkaline solution, the photopolymerized image area serves as an excellent ink-receptor. It also has outstanding abrasion resistance. The resulting plates can be used with excellent results for offset lithographic printing.

EXAMPLE IX

Solution A of Example I is coated onto a woven, mesh-like substrate by procedures described in Examples V, VI and VII. Following exposure to actinic light and development in aqueous alkaline solution, the photopolymerized image area serves as an excellent mask. This application has shown utility in silk-screen type printing.

What is claimed is:

1. A photopolymerizable composition in the form of a dry film on a support capable of being formed into rolls and exhibiting improved cold flow properties comprising:
   (A) from 10 to 60 parts by weight of one or more addition polymerizable non-gaseous ethylenically unsaturated compounds having a boiling point above 100° C.;
   (B) a photo-initiated free-radical generating addition polymerization initiating system; and
   (C) from 40 to 90 parts by weight of a preformed macromolecular polymeric binding agent which is a polymer of
      40 to 60 parts of a first monomeric material which contains one or more styrene-type compounds selected from the group having the general formula:

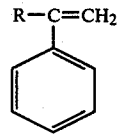

wherein R is hydrogen, an alkyl group having from 1 to 6 carbon atoms or a halo group or ring-substituted derivative thereof;
   15 to 45 percent of a second monomeric material which contains one or more compounds selected from the group comprising alkyl acrylate, alkyl methacrylate, hydroxyalkyl acrylate or an hydroxyalkyl methacrylate wherein the alkyl groups have from 1 to 6 carbon atoms and the hydroxyalkyl groups have from 2 to 6 carbon atoms; and
   15 to 40 percent of a third monomeric material which contains one or more alpha, beta-unsaturated carboxyl-containing monomers having from 3 to 15 carbon atoms;
   the preformed macromolecular binding agent, when dissolved in methyl ethyl ketone to form a 40% solution, having a viscosity of at least 2,000 centipoises on the Brookfield Viscometer;
   the photopolymerizable composition being soluble in an aqueous alkali solution having a pH of from 9 to 14 having a Sward hardness number of from 10 to 20 when in the form of a 1 mil thick film and a Sward hardness number of from 8 to 14 when in the form of 2 mil thick film.

2. The photopolymerizable composition of claim 1 wherein the first monomeric material is styrene.

3. The photopolymerizable composition of claim 1 wherein the second monomeric material is methyl methacrylate or ethyl acrylate, or a combination thereof.

4. The photopolymerizable composition of claim 1 wherein the third monomeric material is methacrylic acid.

5. The photopolymerizable composition of claim 1 wherein the addition polymerizable material is one or more unsaturated esters of a polyol.

6. The photopolymerizable composition of claim 1 wherein the addition polymerizable material is trimethylolpropane triacrylate and tetraethyleneglycol diacrylate.

7. The photopolymerizable composition of claim 1 wherein the addition polymerizable material is diethoxylated Bisphenol A diacrylate and tetraethyleneglycol diacrylate.

8. A photopolymerizable composition comprising:
(A) from 10 to 60 parts by weight of an addition polymerizable material consisting of one or more unsaturated esters of a polyol having a boiling point above 100° C.;
(B) a photo-initiated free-radical generating addition polymerization initiating system; and
(C) from 40 to 90 parts by weight of a preformed macromolecular polymeric binding agent which is a copolymer of
40 to 60 percent of styrene;
15 to 45 percent of acrylate component consisting of methyl methacrylate and ethylacrylate; and
15 to 40 percent of methacrylic acid;
the preformed macromolecular binding agent, when dissolved in methyl ethyl ketone to form a 40% solution, having a viscosity of at least 2,000 centipoises on the Brookfield Viscometer,
the photopolymerizable composition being soluble in an aqueous alkali solution having a pH of from 9 to 14 and having a Sward hardness number of from 10 to 20 when in the form of a 1 mil thick film and a Sward hardness number of from 8 to 14 when in the form of 2 mil thick film.

9. A composition according to claim 1 in which a 40 percent solution of the preformed macromolecular polymeric binding agent in methyl ethyl ketone has a viscosity of from 2500 centipoise to 8,000 centipoise.

10. A composition according to claim 8 in which a 40 percent solution of the preformed macromolecular polymeric binding agent in methyl ethyl ketone has a viscosity of 2,500 centipoise to 8,000 centipoise.

11. A composition according to claim 1 in which the preformed polymeric binding agent is a polymer of 45 to 55 percent of said first monomeric material; 25 to 35 percent of said second monomeric material; and 18 to 30 percent of said third monomeric material.

* * * * *